(12) United States Patent
Tsai et al.

(10) Patent No.: US 8,399,965 B2
(45) Date of Patent: Mar. 19, 2013

(54) LAYER STRUCTURE WITH EMI SHIELDING EFFECT

(75) Inventors: Ming-Fan Tsai, Taichung Hsien (TW);
Hsin-Hung Lee, Taichung Hsien (TW);
Bo-Shiang Fang, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 4 days.

(21) Appl. No.: 13/242,941

(22) Filed: Sep. 23, 2011

(65) Prior Publication Data

US 2013/0032931 A1    Feb. 7, 2013

(30) Foreign Application Priority Data

Aug. 3, 2011    (TW) .............................. 100127520 A

(51) Int. Cl.
*H01L 23/552*    (2006.01)

(52) U.S. Cl. ...................................... 257/659; 257/774

(58) Field of Classification Search .................. 257/659, 257/774, 776; 438/667
See application file for complete search history.

(56) References Cited

U.S. PATENT DOCUMENTS 6,441,470 B1 *    8/2002   Shenoy ......................... 257/659
7,217,887 B2 *    5/2007   Ho .................................. 174/250

* cited by examiner

*Primary Examiner* — Julio J Maldonado
*Assistant Examiner* — Amid Bamba
(74) *Attorney, Agent, or Firm* — Edwards Wildman Palmer LLP; Peter F. Corless; Steven M. Jensen

(57) ABSTRACT

A layer structure with an electromagnetic interference (EMI) shielding effect is applicable for reducing an EMI effect caused by signal transmission between through silicon vias, so as to effectively provide the EMI shielding effect between electrical interconnections of a three-dimensional (3D) integrated circuit. By forming EMI-shielding through silicon vias at predetermined positions between the through silicon vias used for signal transmission, a good EMI shielding effect can be attended, and signal distortion possibly caused by the EMI effect can be reduced between different chips or substrates.

8 Claims, 6 Drawing Sheets

LAYER STRUCTURE WITH EMI SHIELDING EFFECT

CROSS-REFERENCES TO RELATED APPLICATIONS

This application claims under 35 U.S.C. §119(a) the benefit of Taiwanese Application No. 100127520, filed Aug. 3, 2011, the entire contents of which is incorporated herein by reference.

BACKGROUND OF THE INVENTION

1. Field of the Invention

The present invention relates to integrated circuit fabrication processes and integrated circuit substrate structures, and more particularly, to a layer structure providing a shielding effect on near-end electromagnetic interference (EMI) and distal-end EMI between through silicon vias, applicable in the integrated circuit fabrication processes.

2. Description of Related Art

As various portable electronic devices and peripheral products thereof used in communication, network and computer fields have been made more and more compact in size, semiconductor fabrication processes are continuously being improved in its degree of integration, and high-density package structures become a target in response to those electronic devices getting to have more functions and higher performance. Thus, there is being developed three-dimensional (3D) packaging technology for fabricating semiconductor packages, so as to provide a high-density package system suitable for the more compact and better-performance electronic devices.

The 3D packaging technology involves a 3D integrated circuit, allowing a plurality of layers of chips or circuit substrates (including active components) to be integrated by various ways onto a single integrated circuit. More specifically, by the 3D integrated circuit technique, a plurality of chips are integrally mounted on a single integrated circuit in a stereoscopic or 3D manner. Accordingly, the 3D integrated circuit technique requires high-density electrical interconnections for providing electrical contacts on active surfaces and/or back surfaces of the chips in order to achieve the 3D stacking and/or high-density package structure.

Through Silicon Via (TSV) technology is a critical technique used in fabricating the 3D integrated circuit. By forming through silicon vias in the chips or substrate to provide vertical electrical connections, more chips can be stacked on a predetermined area of the integrated circuit and thereby the stacking density is enhanced. Moreover, a good TSV design may effectively integrate different processes or reduce transmission delay, and the use of shorter interconnections reduces power consumption, improves performance and increases transmission bandwidth. Thus, the TSV technology allows the chip-stacking package structure to be further made with low power, high density and miniaturization processes.

FIG. 1 illustrates a silicon substrate 100 having conventional TSV structures. As shown in FIG. 1, the silicon substrate 100 is formed with two through silicon vias 102, 104 between which there is no electromagnetic interference (EMI) shielding structure provided.

However, with the number of through silicon vias of the chip being increased and a pitch between the adjacent through silicon vias becoming smaller, a certain degree of EMI effect may be generated between the plurality of through silicon vias, thereby adversely affecting the overall performance of the chip.

FIG. 2 illustrates a simulation result showing a distal-end EMI effect generated between the through silicon vias 102, 104. As shown in FIG. 2, the distal-end EMI (curve S31T) between the through silicon vias 102, 104 is −47.883 dB under the condition of signal frequency being 10 GHz, and is −67.897 dB under the condition of signal frequency being 1 GHz. Moreover, FIG. 3 illustrates a simulation result showing a near-end EMI effect generated between the through silicon vias 102, 104. As shown in FIG. 3, the near-end EMI (curve S41T) between the through silicon vias 102, 104 is −45.448 dB under the condition of signal frequency being 10 GHz, and is −65.168 dB under the condition of signal frequency being 1 GHz.

Therefore, how to provide a layer structure applicable in a 3D integrated circuit system and capable of diminishing the influence caused by an EMI effect between a plurality of through silicon vias in order to overcome the above drawbacks of the conventional technology, is becoming one of the most popular issues in the art.

SUMMARY OF THE INVENTION

In view of the drawbacks of the prior art such as an unsatisfied package thickness and poor performance of a controller die, it is therefore an objective of the present invention to provide a layer structure with an electromagnetic interference (EMI) shielding effect, applicable in a three-dimensional (3D) integrated circuit, for effectively reducing near-end EMI and distal-end EMI effects between through silicon vias. The layer structure comprises: a body having an upper surface and a lower surface; a first through silicon via formed in the body and extended through the body in a direction vertical to the upper and lower surfaces of the body; a second through silicon via formed in the body, wherein the second through silicon via is parallel to the first through silicon via and is extended through the body; and a plurality of EMI-shielding through silicon vias, each of which is extended through the body and has an axis forming an acute angle with the upper and lower surfaces of the body, wherein at least a path passing between the first and second through silicon vias is formed by the plurality of EMI-shielding through silicon vias, and the EMI-shielding through silicon vias are electrically insulated from the first and second through silicon vias.

Compared to the conventional technology, the layer structure of the present invention can form an EMI shield between electrical interconnections of the 3D integrated circuit so as to effectively reduce an EMI effect, such that distal-end EMI and near-end EMI possibly generated between inputs and outputs can be diminished, and the problem of adversely affecting integrity of electrical signals due to the EMI effect caused by an increase in system complexity can be avoided. Moreover, the layer structure of the present invention can integrate different semiconductor fabricating processes, and uses shortened interconnections for reducing transmission delay and power consumption, thereby enhancing the signal transmission bandwidth and further accelerating the technical progress of the 3D integrated circuit.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention; those in the art can apparently understand these and other advantages and effects after reading the disclosure of this specification. The present invention can also be performed or applied by other different embodiments. Some terms such as "first", "second", "X-shaped", "upper", "lower", "vertical", "parallel" and "a" used in the specification are only for easy illustration but not for limiting the scope of the present invention. The details of the specification may be on the basis of different points and applications, and numerous modifications and variations can be devised without departing from the spirit of the present invention.

Figure 1:
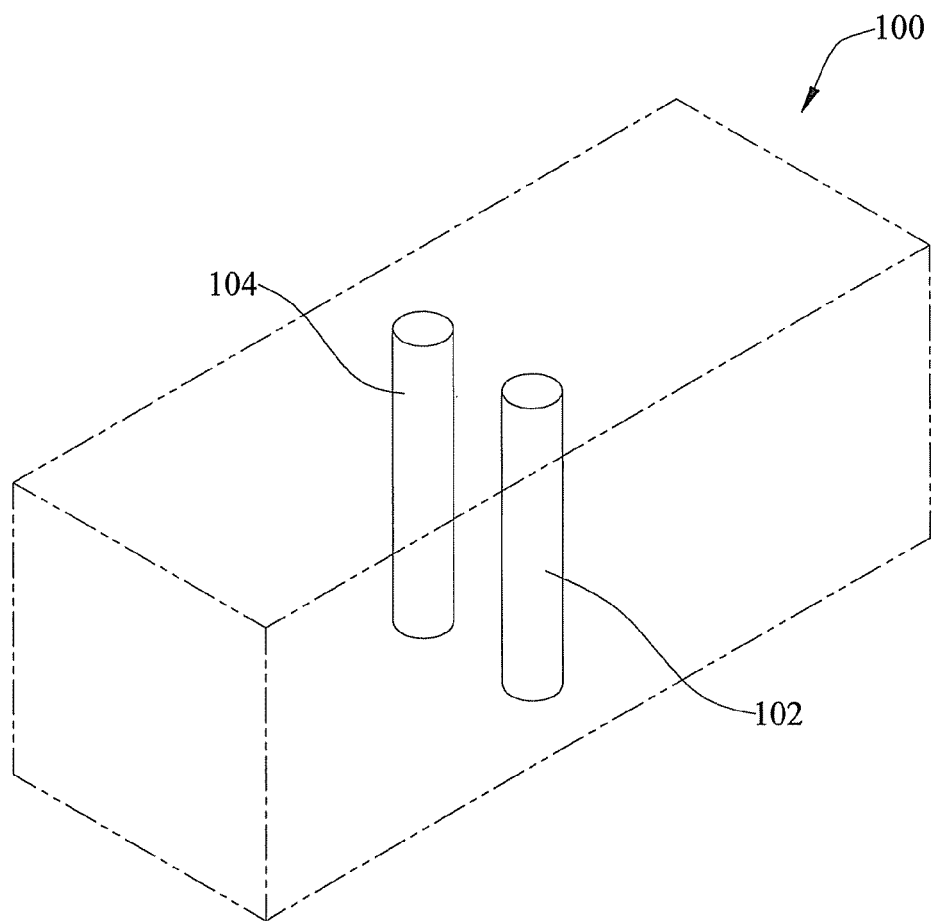
FIG. 1 (PRIOR ART) is a schematic diagram illustrating a silicon substrate having conventional through silicon via structures.
Figure 2:
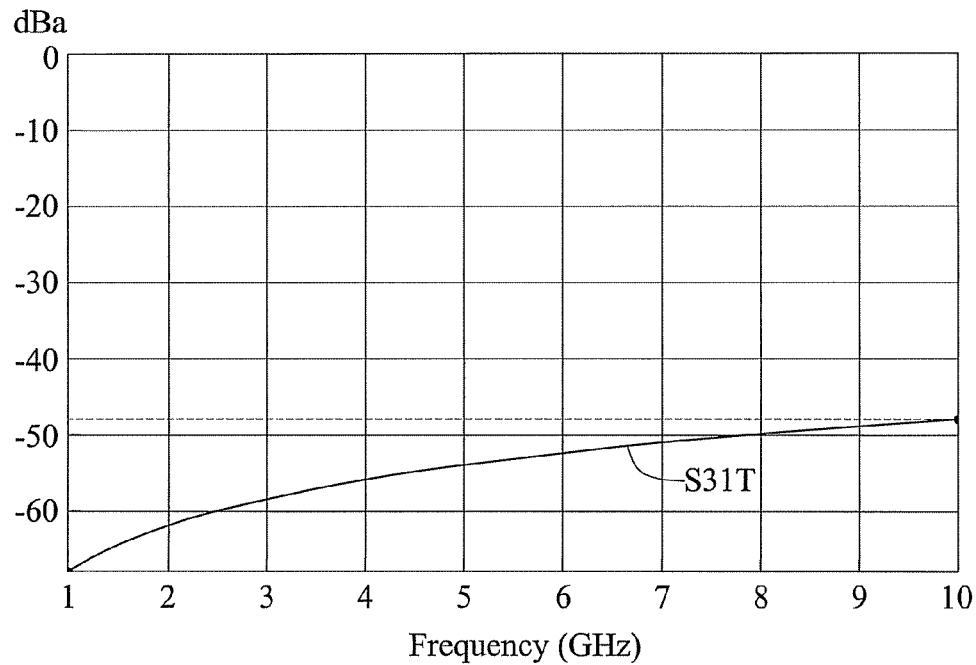
FIG. 2 (PRIOR ART) illustrates a simulation result showing a distal-end EMI effect generated between the through silicon vias in FIG. 1.
Figure 3:
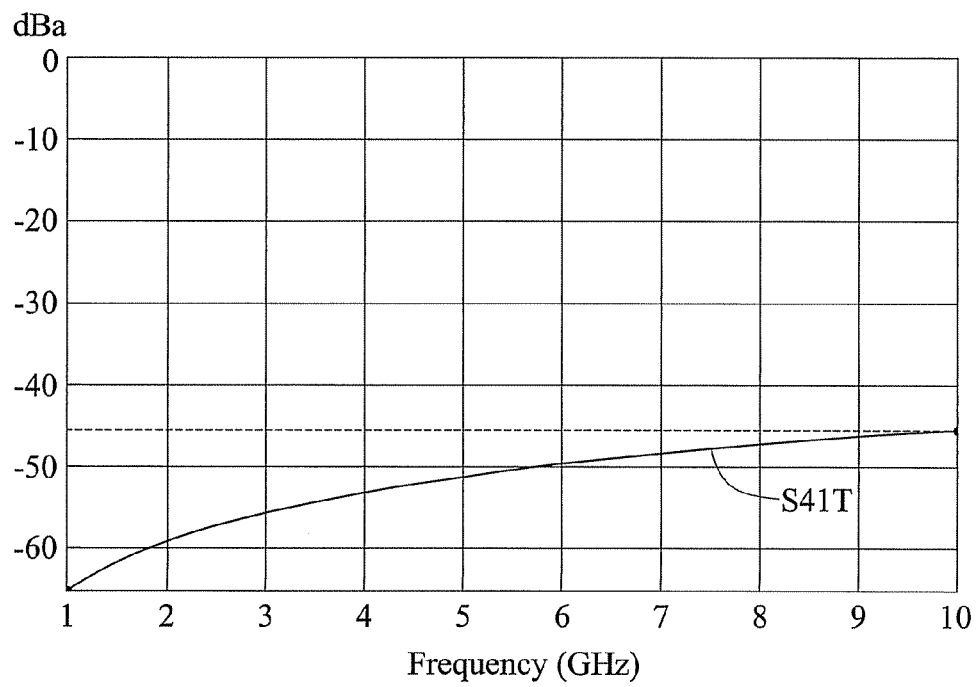
FIG. 3 (PRIOR ART) illustrates a simulation result showing a near-end EMI effect generated between the through silicon vias in FIG. 1.
Figure 4:
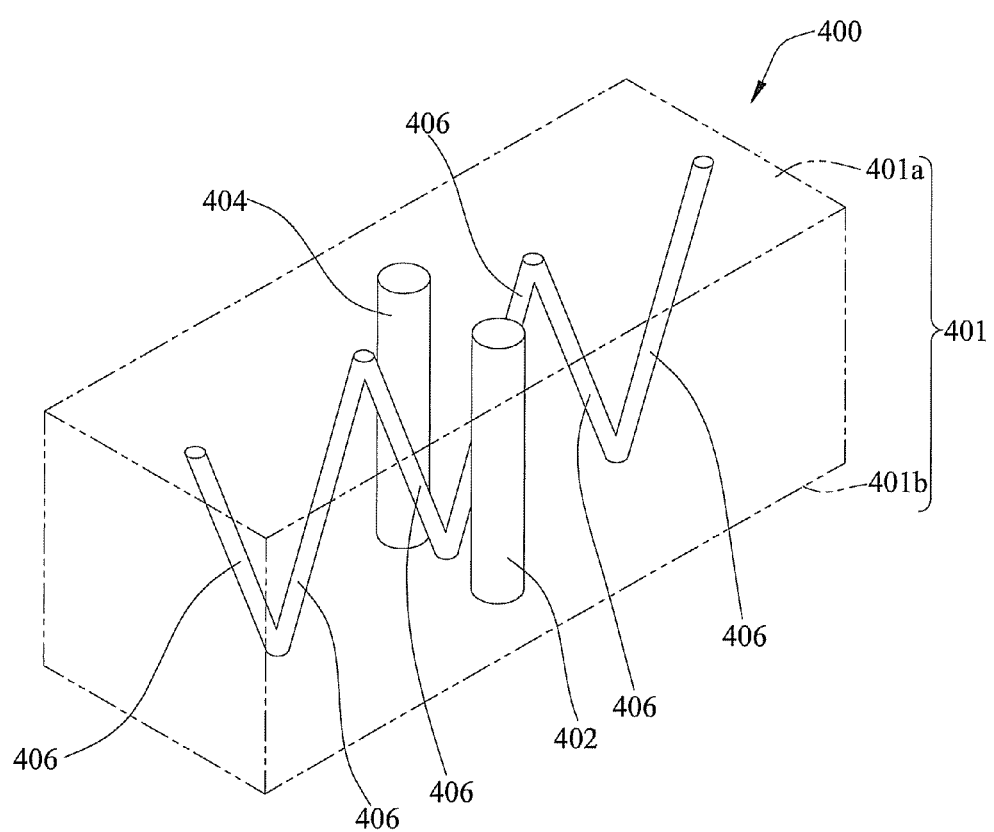
FIG. 4 is a perspective view illustrating a layer structure with EMI shielding structures according to an embodiment of the present invention.

Please refer to FIG. 4, which is a perspective view illustrating a layer structure 400 with EMI shielding structures according to an embodiment of the present invention. As shown in FIG. 4, the layer structure 400 includes: a body 401 made of silicon, germanium, an inorganic insulating material or an organic insulating material, wherein the body 401 has an upper surface 401a and a lower surface 401b; two through silicon vias 402, 404 (for example, made of metal or a semiconductor material); and a plurality of EMI-shielding through silicon vias 406.

The plurality of EMI-shielding through silicon vias 406 are provided between the through silicon vias 402, 404. Each of the EMI-shielding through silicon vias 406 is extended through the body 401 and has an axis forming an acute angle with the upper and lower surfaces 401a, 401b of the body 401. The plurality of EMI-shielding through silicon vias 406 integrally form at least a path passing between the through silicon vias 402, 404, and are electrically insulated from the through silicon vias 402, 404. The plurality of EMI-shielding through silicon vias 406 are made of a conductive material (such as metal or a semiconductor material) and are serially electrically connected to each other. The path formed by the EMI-shielding through silicon vias 406 is saw-shaped, like a V-shaped serial connection structure. In this embodiment, the EMI-shielding through silicon vias 406 are electrically grounded or floated and are provided between the through silicon vias 402, 404, such that an EMI effect between the two through silicon vias 402, 404 can be effectively shielded by the EMI-shielding through silicon vias 406.

Figure 5:
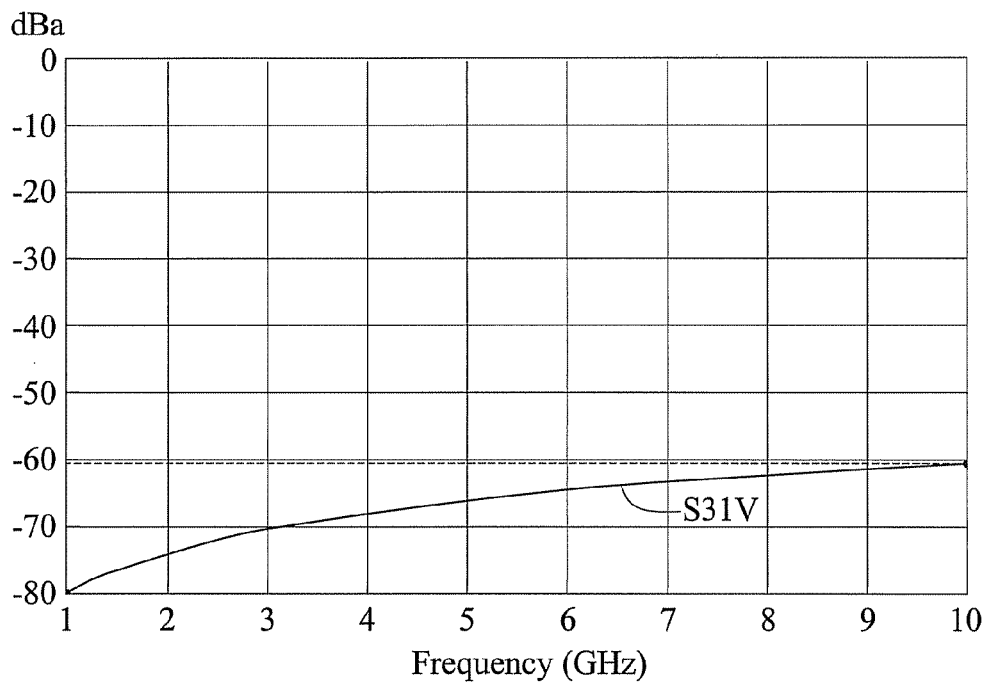
FIG. 5 illustrates a simulation result showing a distal-end EMI effect generated between through silicon vias in FIG. 4.
Figure 6:
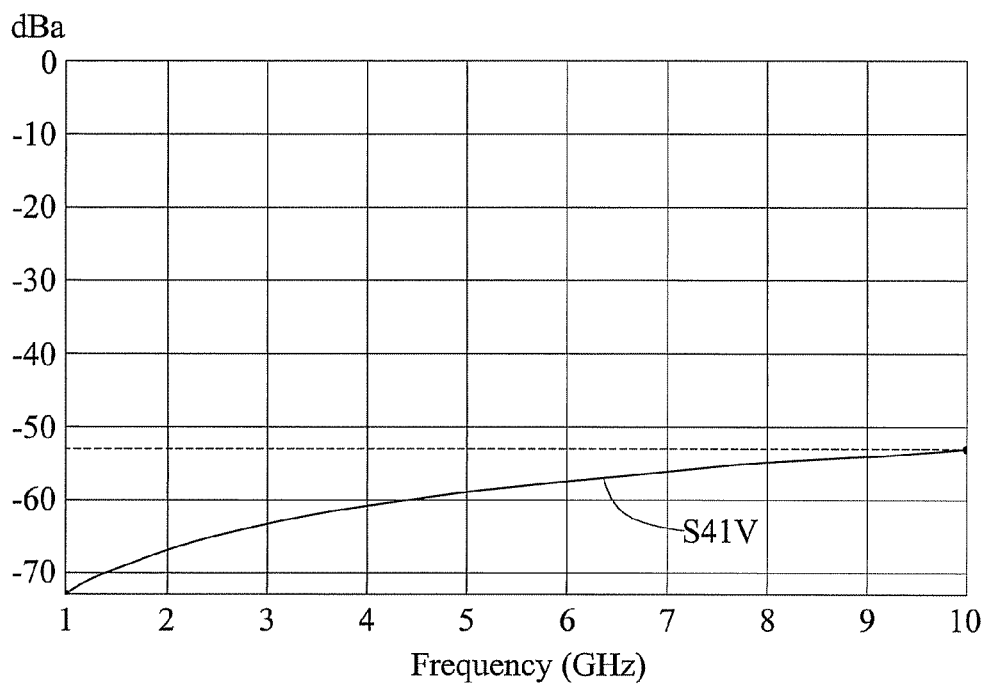
FIG. 6 illustrates a simulation result showing a near-end EMI effect generated between the through silicon vias in FIG. 4.

FIG. 5 illustrates a simulation result showing a distal-end EMI effect generated between the through silicon vias 402, 404 in FIG. 4. As shown in FIG. 5, the distal-end EMI effect (curve S31V) between the through silicon vias 402, 404 is −60.655 dB under the condition of signal frequency being 10 GHz, and is −80.141 dB under the condition of signal frequency being 1 GHz. Moreover, FIG. 6 illustrates a simulation result showing a near-end EMI effect generated between the through silicon vias 402, 404 in FIG. 4. As shown in FIG. 6, the near-end EMI effect (curve S41V) between the through silicon vias 402, 404 is −53.176 dB under the condition of signal frequency being 10 GHz, and is −72.979 dB under the condition of signal frequency being 1 GHz.

Figure 7:
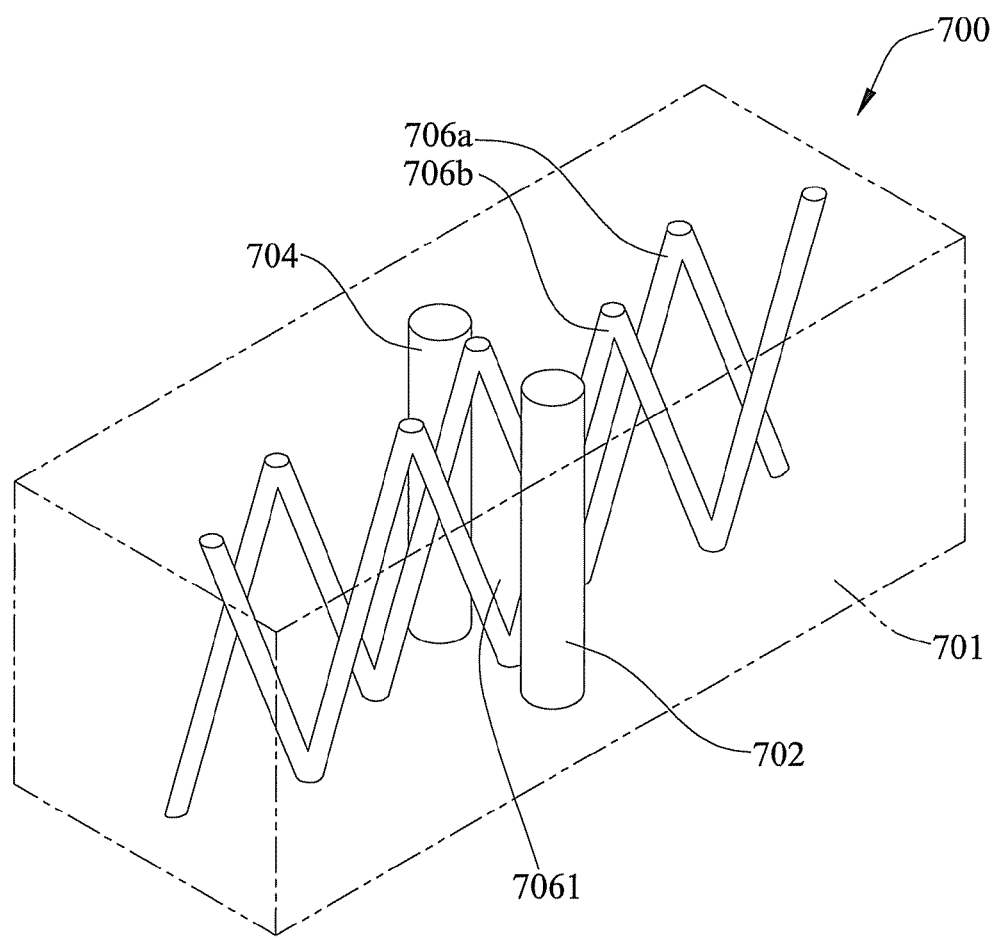
FIG. 7 is a perspective view illustrating a layer structure with EMI shielding structures according to another embodiment of the present invention.

FIG. 7 is a perspective view illustrating a layer structure 700 with EMI shielding structures according to another embodiment of the present invention. As shown in FIG. 7, the layer structure 700 includes: a body 701, two through silicon vias 702, 704 (made of metal or a semiconductor material), and EMI-shielding through silicon vias 706a, 706b.

The EMI-shielding through silicon vias 706a, 706b are provided between the through silicon vias 702, 704 and form at least two saw-shaped paths that integrally form a grid shield. The grid shield includes at least a mesh 7061 between the through silicon vias 702, 704. The EMI-shielding through silicon vias 706a, 706b are respectively electrically insulated from the through silicon vias 702, 704. The EMI-shielding through silicon vias 706a, 706b are made of a conductive material (such as metal or a semiconductor material), and the paths formed by the EMI-shielding through silicon vias 706a, 706b are saw-shaped, like V-shaped serial connection structures. In this embodiment, the EMI-shielding through silicon vias 706a, 706b are electrically grounded or floated, and are provided between the through silicon vias 702, 704 in an X-shaped stagger form, such that an EMI effect between the two through silicon vias 702, 704 can be effectively shielded by the EMI-shielding through silicon vias 706a, 706b. Moreover, in other embodiments of the present invention, the EMI-shielding through silicon vias 706a, 706b may also be made electrically interconnected.

Figure 8:
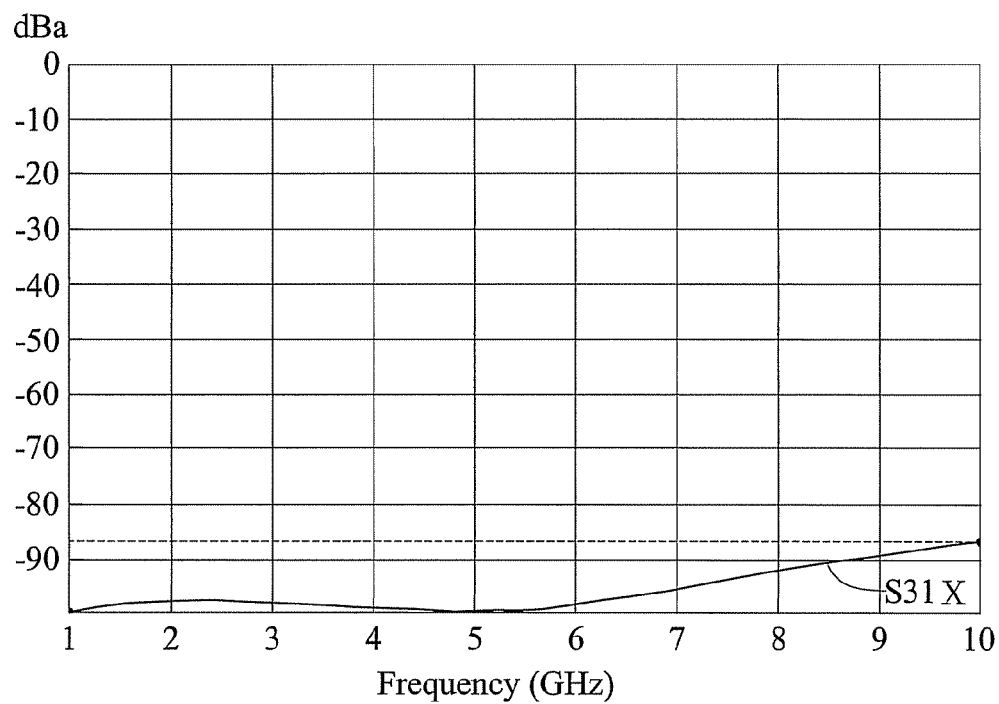
FIG. 8 illustrates a simulation result showing a distal-end EMI effect generated between through silicon vias in FIG. 7.
Figure 9:
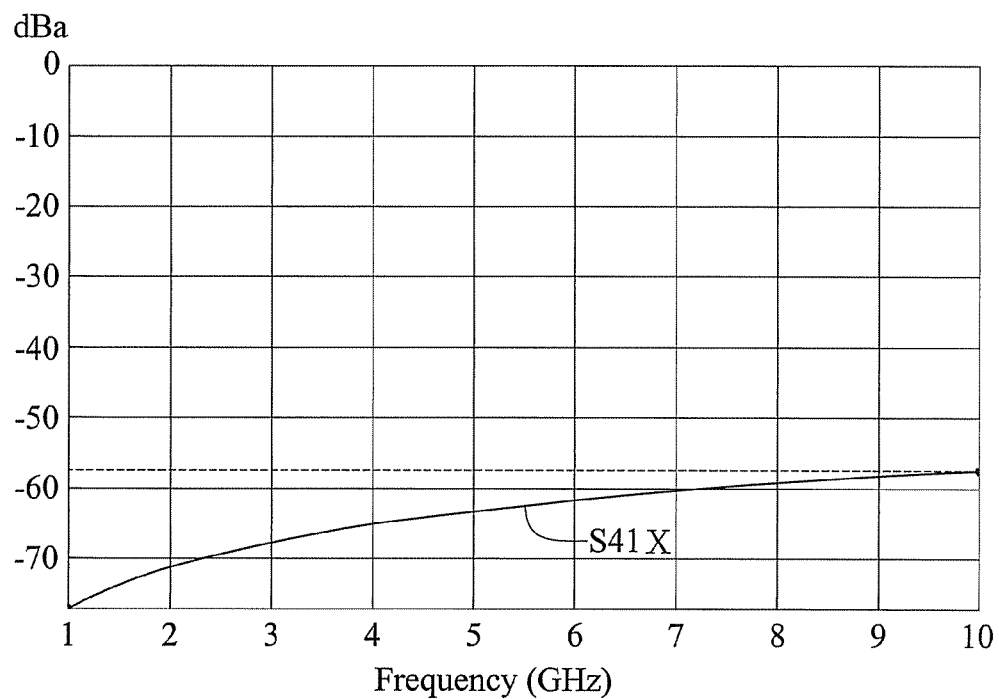
FIG. 9 illustrates a simulation result showing a near-end EMI effect generated between the through silicon vias in FIG. 7.

FIG. 8 illustrates a simulation result showing a distal-end EMI effect generated between the through silicon vias 702, 704 in FIG. 7. As shown in FIG. 8, the distal-end EMI effect (curve S31X) between the through silicon vias 702, 704 is −86.653 dB under the condition of signal frequency being 10 GHz, and is −99.366 dB under the condition of signal frequency being 1 GHz. Moreover, FIG. 9 illustrates a simulation result showing a near-end EMI effect generated between the through silicon vias 702, 704 in FIG. 7. As shown in FIG. 9, the near-end EMI effect (curve S41X) between the through silicon vias 702, 704 is −57.426 dB under the condition of signal frequency being 10 GHz, and is −77.229 dB under the condition of signal frequency being 1 GHz.

Therefore, the layer structure with EMI shielding structures according to the present invention can effectively reduce an EMI effect between electrical interconnections of a 3D integrated circuit, such that distal-end EMI and near-end EMI possibly generated between inputs and outputs can be diminished. Moreover, compared to the conventional technology, the layer structure of the present invention can avoid the problem of affecting integrity of electrical signals due to the EMI effect caused by an increase in system and signal complexity, as well as can integrate different semiconductor fabricating processes, so as to effectively reduce the adverse influence from distal-end EMI and near-end EMI on signal transmission between chips or substrates, thereby improving the reliability of both semiconductor devices and fabrication processes.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A layer structure with an electromagnetic interference (EMI) shielding effect, applicable in a three-dimensional (3D) integrated circuit, the layer structure comprising:
   a body having an upper surface and a lower surface;
   a first through silicon via formed in the body and extended through the body in a direction vertical to the upper and lower surfaces of the body;
   a second through silicon via formed in the body, wherein the second through silicon via is parallel to the first through silicon via and is extended through the body; and
   a plurality of EMI-shielding through silicon vias, each of which is extended through the body and has an axis forming an acute angle with the upper and lower surfaces of the body, wherein at least a path passing between the first and second through silicon vias is formed by the plurality of EMI-shielding through silicon vias, and the EMI-shielding through silicon vias are electrically insulated from the first and second through silicon vias.

2. The layer structure with an EMI shielding effect of claim 1, wherein the body is made of an inorganic insulating material or an organic insulating material.

3. The layer structure with an EMI shielding effect of claim 1, wherein the body is a silicon substrate.

4. The layer structure with an EMI shielding effect of claim 1, wherein the first and second through silicon vias are made of metal or a semiconductor material.

5. The layer structure with an EMI shielding effect of claim 1, wherein the plurality of EMI-shielding through silicon vias are serially connected to each other, and the path formed by the EMI-shielding through silicon vias is saw-shaped.

6. The layer structure with an EMI shielding effect of claim 1, wherein there are at least two saw-shaped paths formed by the plurality of EMI-shielding through silicon vias, and a grid shield is formed by the at least two saw-shaped paths and includes at least a mesh between the first and second through silicon vias.

7. The layer structure with an EMI shielding effect of claim 1, wherein there are at least two saw-shaped paths formed by the plurality of EMI-shielding through silicon vias, and a grid shield is formed by the at least two saw-shaped paths, wherein at least two of the EMI-shielding through silicon vias are provided in an X-shaped stagger form between the first and second through silicon vias.

8. The layer structure with an EMI shielding effect of claim 7, wherein the at least two EMI-shielding through silicon vias in the X-shaped stagger form are electrically connected to each other.

* * * * *